US007161426B2

United States Patent
Hu et al.

(10) Patent No.: US 7,161,426 B2
(45) Date of Patent: Jan. 9, 2007

(54) RF POWER AMPLIFIER SYSTEM HAVING A PLURALITY OF DIFFERENT POWER CONTROL MODES

(75) Inventors: Zhiqun Hu, Liberty Township, OH (US); Dmitriy Borodulin, Mason, OH (US)

(73) Assignee: Harris Corporation, Melbourne, FL (US)

( * ) Notice: Subject to any disclaimer, the term of this patent is extended or adjusted under 35 U.S.C. 154(b) by 19 days.

(21) Appl. No.: 10/889,428

(22) Filed: Jul. 12, 2004

(65) Prior Publication Data

US 2006/0006940 A1    Jan. 12, 2006

(51) Int. Cl.
*H03G 3/20* (2006.01)
(52) U.S. Cl. ..................... 330/129; 330/136
(58) Field of Classification Search ........ 330/129, 330/136; 455/127.2, 127.4
See application file for complete search history.

(56) References Cited

U.S. PATENT DOCUMENTS

| 5,276,917 A | 1/1994 | Vanhanen et al. ............. 455/89 |
| 5,361,403 A | 11/1994 | Dent ............................ 455/74 |
| 5,541,554 A | 7/1996 | Stengel et al. ................ 330/51 |
| 6,842,072 B1* | 1/2005 | Cheng et al. ............... 330/136 |
| 2003/0099032 A1* | 5/2003 | Asao et al. .............. 359/341.4 |

* cited by examiner

*Primary Examiner*—Steven J. Mottola
(74) *Attorney, Agent, or Firm*—Tarolli, Sundheim, Covell & Tummino LLP

(57) ABSTRACT

A multiple mode RF power amplifier system is presented having N different power control modes for controlling the level of the output RF power relative to applied input power. The system includes a mode controller that receives one of N different mode select commands and in response thereto selects one of N different control modes to be operational. A gain controller controls the gain of the power amplifier system so as to control the level of the output RF power as a function of a control signal applied thereto. The control signal is applied to the gain controller wherein the control signal has a value dependent upon which of the N modes has been selected.

9 Claims, 4 Drawing Sheets

RF POWER AMPLIFIER SYSTEM HAVING A PLURALITY OF DIFFERENT POWER CONTROL MODES

BACKGROUND OF THE INVENTION

1. Technical Field

The present invention is directed to the art of RF power amplifier systems suitable for use in RF broadcast transmission systems and, more particularly, to improvements for such amplifier systems to be operated in different power control modes.

2. Description of the Prior Art

RF power amplifiers are known in the art and are used in Radio and Television broadcast applications. Such amplifiers may need to be operated in different power control modes, such as automatic level control (ALC), automatic gain control (AGC) or manual gain control (MGC). In the ALC mode, the output power of the power amplifier is proportional to the ALC reference; and it does not have a direct relationship to the input power. In the AGC mode, the output power is proportional to the input power. In the MGC mode, the output power is directly related to a signal that may be applied to a gain control device, such as an attenuator.

It is desirable that such an RF power amplifier be easily configured so that it can operate in either of the ALC or AGC or MGC modes. This will permit the same RF power amplifier configuration to be used in different applications. For example, the same amplifier could be used as a basic power unit at a final amplification stage or it could be used as an RF driver or a preamplifier in an overall power amplification system. If the power amplifier is used as a driver, instead of operating in ALC mode, it may be desirable to operate in either an AGC or in an MGC mode to work inside of an overall ALC loop. Since most traditional RF amplifiers use hardware to implement the power control loop, there is no easy way to switch the control mode or change the gain during operation. Consequently, the amplifier could be operated only in one of the three different modes without making changes to hardware.

SUMMARY OF THE INVENTION

In accordance with the present invention, a multiple mode RF power amplifier system is provided that has N different power modes for controlling the level of the output power. The system includes a controller that receives one of N different mode select commands and in response thereto selects one of N different control modes to be operational. The controller controls the gain of the power amplifier system so as to control the level of the output RF power as a function of a control signal applied thereto. A control signal is applied to the controller wherein the control signal has a value dependent upon which of the N modes has been selected.

BRIEF DESCRIPTION OF THE DRAWINGS

The foregoing and other advantages of the invention will become more readily apparent to one skilled in the art to which the present invention relates upon consideration of the following description of the invention with reference to the accompanying drawings, wherein.

DESCRIPTION OF THE PREFERRED EMBODIMENT

Figure 1:
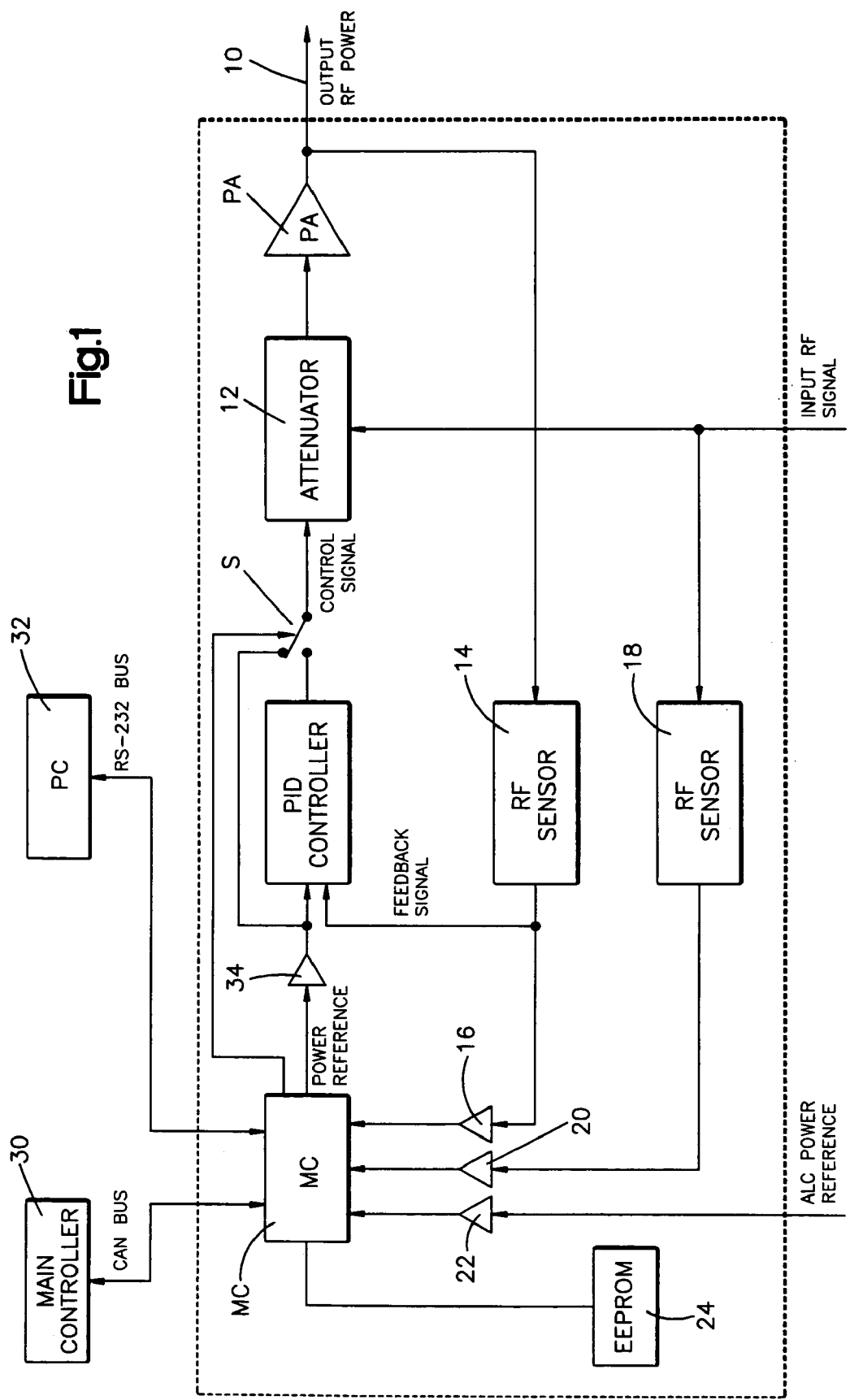
FIG. 1 is a schematic-block diagram of one embodiment of the present invention.

Reference is now made to FIG. 1 which illustrates one embodiment of the present invention.

The power amplifier system of FIG. 1 includes a power amplifier PA located downstream of signal flow to supply an output RF power signal at an output circuit 10. Additionally, the power amplifier system includes the microcontroller MC, a power regulator unit such as a PID controller, and a variable attenuator 12. The output RF power is applied to an RF sensor 14 which includes an envelope detector. Rectified signal then is passed to the PID controller and to an analog to digital converter 16. The converter 16 generates digital signal that is representative of envelope of output RF signal. It passes the signal to the microcontroller MC. The input RF signal is supplied to an attenuator 12. RF sensor 18 includes an envelope detector. It originates a sample of input RF signal. A sample of input RF signal is supplied to the analog to digital converter 20. The converter 20 passes the digital sample of input RF signal to the microcontroller MC. An ALC power reference is supplied by way of an analog to digital converter 22 to the microcontroller MC. Also, an EEPROM 24 supplies inputs to the microcontroller MC.

The microcontroller MC also receives inputs from a main controller 30 by way of a CAN BUS and receives inputs from a personal computer PC 32 by way of an RS-232 BUS. The microcontroller MC supplies a power reference by way of a digital-to-analog converter 34. The power reference may be supplied as one input to a PID controller as well as directly to an attenuator 12 by way of a switch S, when in the raised position (as shown). Switch S may take the form of a solid state switch and, for example, may be an analog switch. Switch S supplies a control signal to the attenuator for purposes to be described in greater detail hereinafter. The PID controller also receives an input feedback signal from the RF sensor 14 and this is representative of the output RF signal. The PID controller can be implemented in hardware using an operation amplifier or implemented in software in a microcontroller based on the requirement of the control response time. The description presented herein with reference to FIG. 1 contemplates a hardware implementation. The software implementation has the same analogy.

Figure 2:
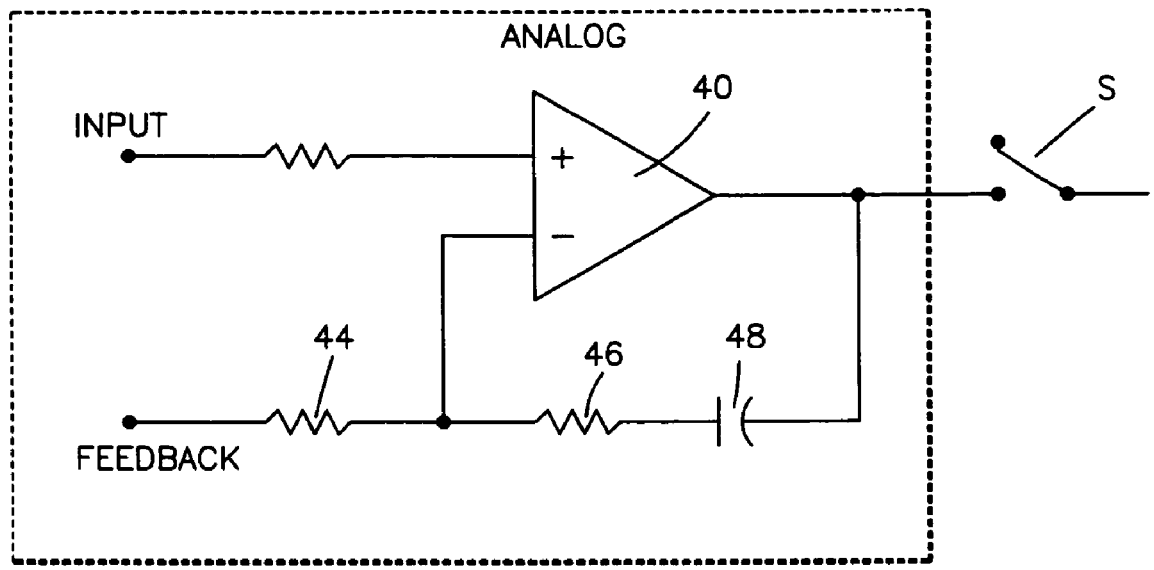
FIG. 2 is a schematic-block diagram illustration of the PID controller illustrated in FIG. 1.

The hardware implementation of the PID controller may take the form as shown in FIG. 2 which includes an analog operational amplifier 40. An input signal, taken from the power reference digital-to-analog converter 34 and supplied by way of a resistor 42, is applied to the positive or non-inverting input. A feedback signal from the RF sensor 14 is supplied by way of a resistor 44 to the negative or inverting input of the operational amplifier. A resistor 46 and a capacitor 48 are connected together in series from the negative input to the output of the operational amplifier.

Figure 3:
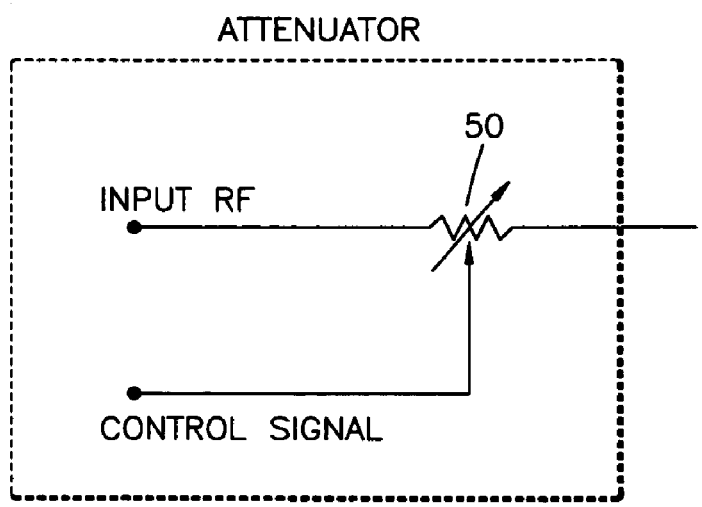
FIG. 3 is a schematic illustration of the attenuator illustrated in FIG. 1.

The gain controller or attenuator 12 may take the form of the analog circuit shown in FIG. 3 which illustrates a variable resistor 50 controlled by the control signal obtained from switch S. This will vary the magnitude of the input RF signal supplied thereto, the output of the attenuator is supplied to the power amplifier PA.

A power reference signal provided by the microcontroller MC and supplied through the digital-to-analog converter 34 is applied as a reference signal to the PID controller along with a feedback signal obtained from the output RF sensor 14. The PID controller generates the control signal supplied to the attenuator 12 to regulate gain based on the reference and feedback signals.

ALC Mode

In this mode, the output power is held constant regardless of the level of the input power or temperature changes or changes in the magnitude of the supply voltage, because of drifting and/or aging. This mode employs the PID controller and the attenuator. In this mode, the MC microcontroller supplies constant level signal as the power reference and it is passed by way of the digital-to-analog converter 34 at the input of PID controller. The ALC reference can come from one of three different sources. During normal operation, the ALC reference is from the CAN BUS sent by a system controller, such as by the main controller 30. Also, at the life support mode condition (when the system controller has failed), the ALC reference will be provided via an analog voltage by a life support controller. Also, at a bench test, the ALC reference could be provided by way of a personal computer using a serial interface as means of communication. The output power signal is converted in a voltage signal with the use of an RF sensor 14 and supplied to the PID controller. PID controller closes the ALC loop by controlling the insertion loss of attenuator 12 and, therefore, the output RF signal level 10.

AGC Mode

This is a constant gain operation as opposed to the constant power of the ALC mode. The gain is held constant regardless of variations in temperature or power supply voltage. If the gain is constant, then the output power follows changes in the input power.

In this mode, the input power signal obtained from the input RF sensor 18 is supplied to the microcontroller MC by way of the analog-to-digital converter 20. The signal is used as a power reference to the PID controller by way of the digital-to-analog converter 34. The input power is processed in accordance with the gain setting as the power reference. The gain setting for the AGC mode is by way of a personal computer 32 or the main controller 30 by the serial buses thereto. The gain setting is stored in a non-volatile memory EEPROM 24. Thus, the amplifier system will operate with the gain set even after the AC is interrupted. Most analog AGC control circuits have some kind of potentiometers to tune the amplifier for different gain sets and once gain set is done, it will not be easily changed without physically making access to the hardware. In accordance with the present invention, the gain setting of the AGC is done by way of the PC or main controller passing the desired Gain setting through the serial buses. Thus, the gain setting can be adjusted even in the situation where the power amplifier cannot be accessed.

MGC Mode

This is a manual mode and gain is manually adjustable in the sense that the gain may be set by the operator. In this mode the switch S is positioned to its upward or B position electronically by microcontroller MC. In MGC mode, the control signal from the digital-to-analog converter 34 directly controls the attenuator 12. The gain set in this mode may be set by way of the serial communication bus from Main controller or PC to the microcontroller and stored in the memory EEPROM. As shown in FIG. 1, the control signal generated by the microcontroller will switch on or off the analog switch as desired to have the amplifier work in either the MGC mode, which is an open loop mode, or in a closed loop mode (either ALC or AGC). The MGC mode could be selected through the main controller or through the PC at the configuration time. The selected mode is stored in the non-volatile memory EEPROM 24. Consequently, the amplifier system will operate in the selected mode even after AC is interrupted.

From the foregoing, it is seen that the amplifier system may operate in different modes. The single power amplifier could have many different applications or used in different products. The operational mode may be easily configured by way of a serial communication bus without changing any hardware and without any modification to the power amplifier. The power amplifier's gain may be adjusted by software via communication with either an external controller or with a PC. The gain setting may be stored in non-volatile memory to be used after AC power interruption. The same amplifier may be used for different applications or different products or the same application, which requires variable gain in different operational conditions.

Figure 4:
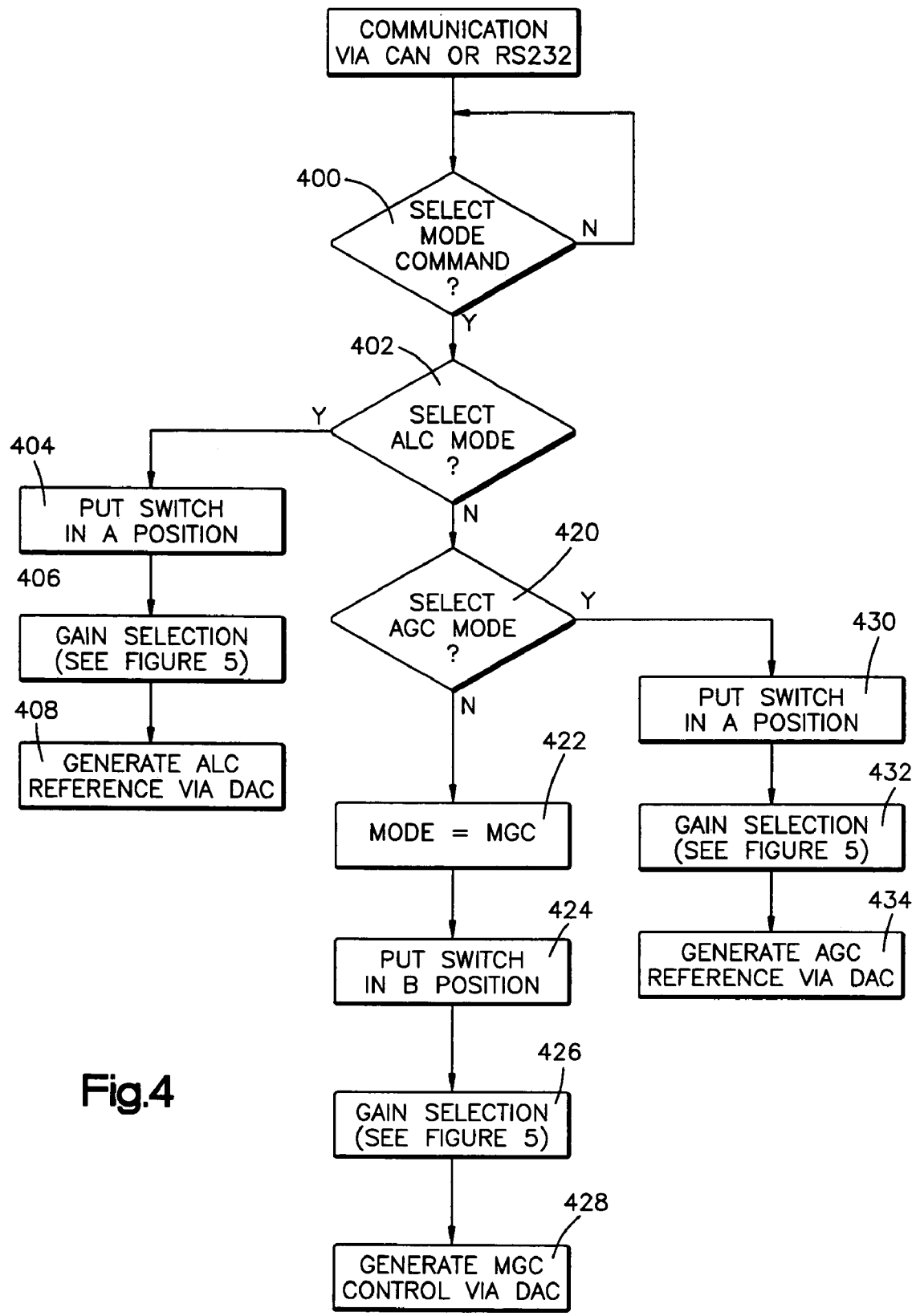
FIG. 4 is a flow diagram illustrating the operation for selecting mode.
Figure 6:
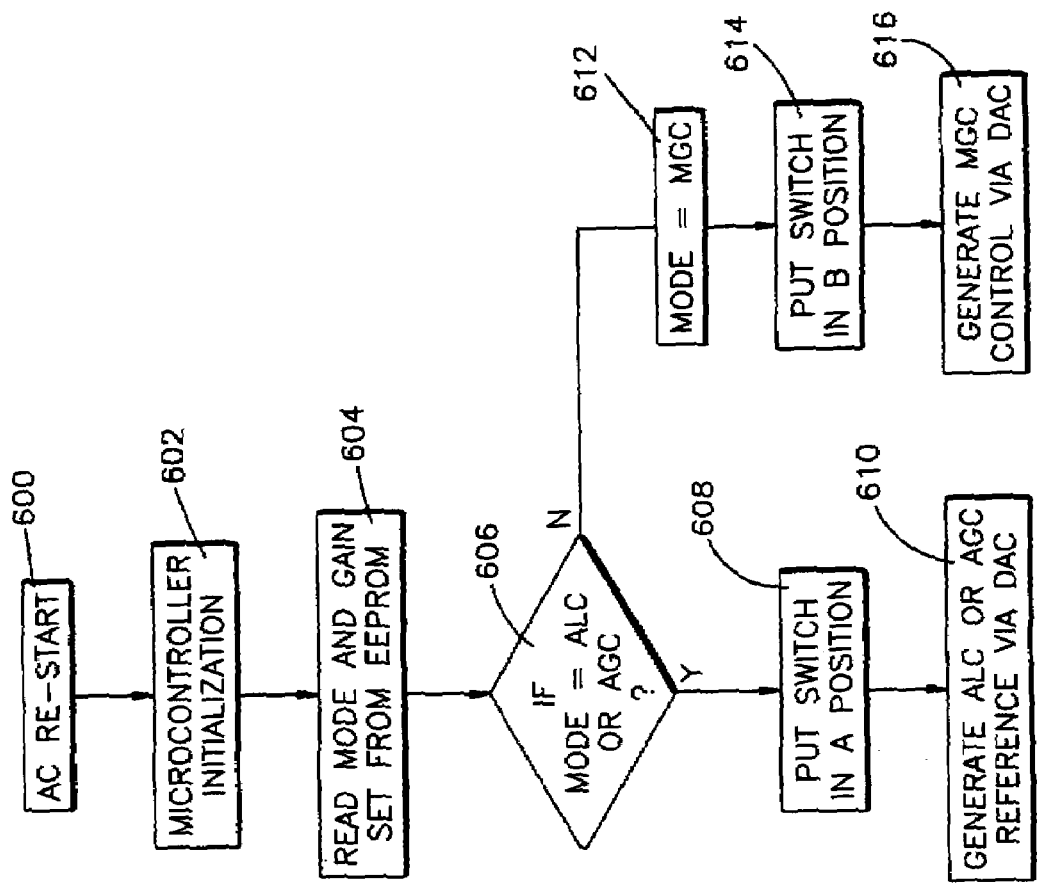
FIG. 6 is a flow diagram illustrating the mode control at the restart process.
Figure 5:
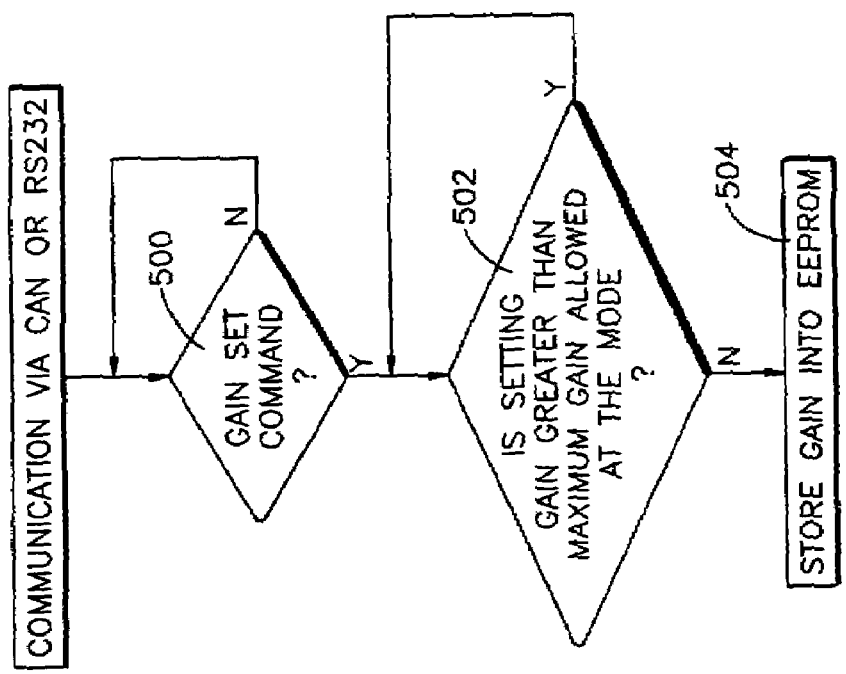
FIG. 5 is a flow diagram illustrating the operation for selecting gain.

Reference is now made to the flow diagrams shown in FIGS. 4, 5 and 6 that illustrate the operation in accordance with the program stored in the microcomputer MC. As shown in FIG. 4, the system is awaiting a select mode command by way of the CAN bus or the RS-232 bus from the main controller or the PC and this takes place in step 400. If a select mode command is received, the procedure advances to step 402 to determine whether or not the select mode command is a select ALC mode command. If so, the procedure advances to step 404 during which the switch S is placed in the down position (A position). Thereafter, the procedure advances to step 406 during which the gain selection is achieved in accordance with the procedure set forth in FIG. 5 herein (to be described below). The procedure advances to step 408 during which the ALC reference is generated by way of digital-to-analog converter 34.

If the determination at step 402 is negative, the procedure advances to step 420 during which a determination is made as to whether the command is to select the AGC mode. If not, this means that the command is to select the MGC mode as set forth in step 422. The procedure advances to step 424 wherein the switch S is placed in the up or B position, as is shown in FIG. 1. The procedure advances to step 426 during which the gain selection is made in accordance with that set forth in FIG. 5 (to be described hereinafter). Thereafter, the procedure advances to step 428 during which the MGC control is generated by way of the DAC 34.

If a positive determination was made at step 420, the procedure advances to step 430 during which the switch S is placed in the down or A position. Thereafter, the procedure advances to step 432 during which the gain selection is accomplished pursuant to the procedure set forth in FIG. 5 (to be described below). Thereafter, the procedure advances to step 434 during which the AGC reference is generated by way of the DAC 34.

Reference is now made to FIG. 5 which illustrates the gain selection process employed by the microcontroller MC. In this process, a determination is made in step 500 as to whether a gain set command has been received. If such a command has been received, the process advances to step 502 at which a determination is made as to whether the gain is to be set greater than the maximum gain allowed at the mode. If not, then the gain is stored in step 504 in the EEPROM 24.

Reference is now made to FIG. 6 which illustrates the mode control process at AC restart.

The process commences with step 600 and advances to step 602 during which the microcontroller MC is initialized. The process advances to step 604 during which the mode and gain set in the EEPROM 24 are read.

The procedure advances to step 606 during which a determination is made as to whether the mode to be in effect is ALC or AGC.

If in step 606 a YES determination was made, the procedure advances to step 608 during which the switch S in FIG. 1 is placed in the lower position for connecting the PID controller to the attenuator 12. The procedure then advances to 610 during which procedure the ALC or AGC is generated with the reference from the DAC 34.

If the decision in step 606 was negative, the procedure advances to step 612 with the mode selection being MGC. The procedure advances to step 614 during which the switch S in FIG. 1 is placed in the upward or B position and the procedure advances to step 616. In step 616 the MGC is generated by the DAC 34.

Although the foregoing has been described in conjunction with a preferred embodiment, it is to be appreciated that various modifications may be made without departing from the spirit and scope of the invention as defined by the appended claims.

Having described the invention, the following is claimed:

1. A multiple mode RF power amplifier system having N different power control modes for controlling the level of the output RF power and comprising:
   a mode controller receives one of N different power control mode select commands and in response thereto selects one of N different power control modes to be operational;
   a gain controller that controls the gain of the power amplifier system so as to control the level of the output RF power as a function of a control signal applied thereto; and
   means for applying said control signal to said gain controller wherein said control signal has a value dependent upon which of said N modes has been selected;
   said control modes include an automatic level control (ALC) mode and an automatic gain control (AGC) mode.

2. A multiple mode RF power amplifier system having N different power control modes for controlling the level of the output RF power and comprising:
   a mode controller receives one of N different power control mode select commands and in response thereto selects one of N different power control modes to be operational;
   a gain controller that controls the gain of the power amplifier system so as to control the level of the output RF power as a function of a control signal applied thereto; and
   means for applying said control signal to said gain controller wherein said control signal has a value dependent upon which of said N modes has been selected;
   said control modes include an automatic level control (ALC) mode and a manual gain control (NGC) mode.

3. A multiple mode RF power amplifier system having N different power control modes for controlling the level of the output RF power and comprising:
   a mode controller receives one of N different power control mode select commands and in response thereto selects one of N different power control modes to be operational;
   a gain controller that controls the gain of the power amplifier system so as to control the level of the output RF power as a function of a control signal applied thereto; and
   means for applying said control signal to said gain controller wherein said control signal has a value dependent upon which of said N modes has been selected;
   said control modes include an automatic gain control (AGC) mode and a manual gain control (NGC) mode.

4. A multiple mode RF power amplifier system having N different power control modes for controlling the level of the output RF power and comprising:
   a mode controller receives one of N different power control mode select commands and in response thereto selects one of N different power control modes to be operational;
   a gain controller that controls the gain of the power amplifier system so as to control the level of the output RF power as a function of a control signal applied thereto; and
   means for applying said control signal to said gain controller wherein said control signal has a value dependent upon which of said N modes has been selected;
   said control modes include an automatic level control (ALC) mode, an automatic gain control (AGC) mode and a manual gain control (NGC) mode.

5. A system as set forth in claim 1 including means for providing said N different mode select commands.

6. A system as set forth in claim 1 including means for providing first and second different mode select commands that respectively represent automatic level control (ALC) mode and automatic gain control (AGC) mode.

7. A system as set forth in claim 2 including means for providing second and third mode select commands that respectively represent automatic level control (ALC) mode and manual gain control (MGC) mode.

8. A system as set forth in claim 3 including means for providing second and third different mode select commands that respectively represent automatic gain control (AGC) mode and manual gain control (MGC) mode.

9. A system as set forth in claim 4 including means for providing first, second and third mode select commands that respectively represent automatic level control (ALC) mode, automatic gain control (AGC) mode and manual gain control (MGC) mode.

* * * * *

UNITED STATES PATENT AND TRADEMARK OFFICE
CERTIFICATE OF CORRECTION

PATENT NO. : 7,161,426 B2 Page 1 of 1
APPLICATION NO. : 10/889428
DATED : January 9, 2007
INVENTOR(S) : Zhiqun Hu et al.

It is certified that error appears in the above-identified patent and that said Letters Patent is hereby corrected as shown below:

Column 6, line 2, after "control" delete "(NGC)" and insert --(MGC)--.

Column 6, line 20, after "control" delete "(NGC)" and insert --(MGC)--.

Column 6, line 39, after "control" delete "(NGC)" and insert --(MGC)--.

Signed and Sealed this

Twenty-fourth Day of April, 2007

JON W. DUDAS
*Director of the United States Patent and Trademark Office*